United States Patent [19]
Umezawa

[11] Patent Number: 5,990,550
[45] Date of Patent: Nov. 23, 1999

[54] INTEGRATED CIRCUIT DEVICE COOLING STRUCTURE

[75] Inventor: Kazuhiko Umezawa, Tokyo, Japan

[73] Assignee: NEC Corporation, Tokyo, Japan

[21] Appl. No.: 09/049,123

[22] Filed: Mar. 27, 1998

[30] Foreign Application Priority Data

Mar. 28, 1997 [JP] Japan ................................. 9-078171

[51] Int. Cl.⁶ .............................. H01L 23/34; H05K 7/20
[52] U.S. Cl. ........................ 257/712; 257/713; 257/706; 257/707; 257/697
[58] Field of Search .................................. 257/712, 713, 257/706, 707, 697

[56] References Cited

U.S. PATENT DOCUMENTS

| 5,396,403 | 3/1995 | Patel ........................................ 257/713 |
| 5,523,260 | 6/1996 | Missele ................................... 437/209 |
| 5,585,671 | 12/1996 | Nagesh et al. .......................... 257/713 |
| 5,744,863 | 4/1998 | Culnane et al. ........................ 257/713 |
| 5,751,062 | 5/1998 | Daikaku et al. ........................ 257/713 |

FOREIGN PATENT DOCUMENTS

| 0 630 176 A1 | 12/1994 | European Pat. Off. . |
| 0 661 739 A2 | 7/1995 | European Pat. Off. . |
| 0 709 883 A1 | 5/1996 | European Pat. Off. . |
| 37 16 196 A1 | 3/1988 | Germany . |
| 5-82686 | 4/1993 | Japan . |
| 7-58253 | 3/1995 | Japan . |
| 7-321258 | 12/1995 | Japan . |

OTHER PUBLICATIONS

Japanese Office Action datedOct. 20, 1998, with partial translation.
"Thermal Compound for Semiconductor Packages", by E. R. Mondou and S. P.Young, IBM Technical Disclosure Bulletin, vol. 25 No. 7B, Dec. 1982, pp. 4035–4036.
"Parts and Packaging Technologies for GS8600 and GS8400" by Y. Morita et al., FUJITSU. 47.2., Mar. 1996, pp. 132–138.

*Primary Examiner*—Wael M. Fahmy
*Assistant Examiner*—Hung Van Duong
*Attorney, Agent, or Firm*—McGinn & Gibb, P.C.

[57] ABSTRACT

An integrated circuit device cooling structure includes a wiring substrate, an integrated circuit device, a heat sink, and heat radiation vias. The integrated circuit device is mounted on the first surface side of the wiring substrate. The heat sink is fixed to the second surface of the wiring substrate and thermally coupled to the wiring substrate. The heat radiation vias are formed in the wiring substrate to transmit heat generated by the integrated circuit device to the heat sink.

15 Claims, 5 Drawing Sheets

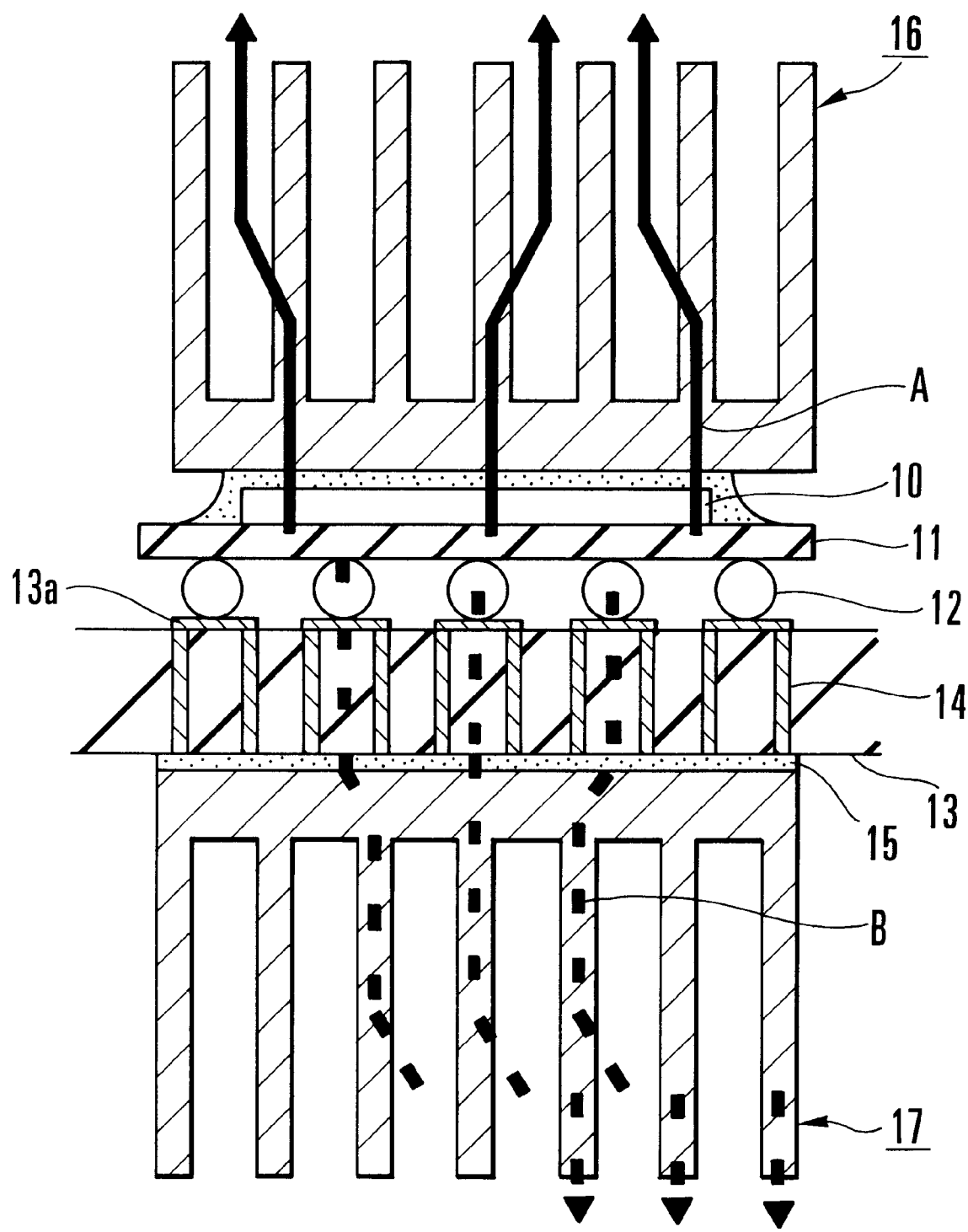
F I G. 4

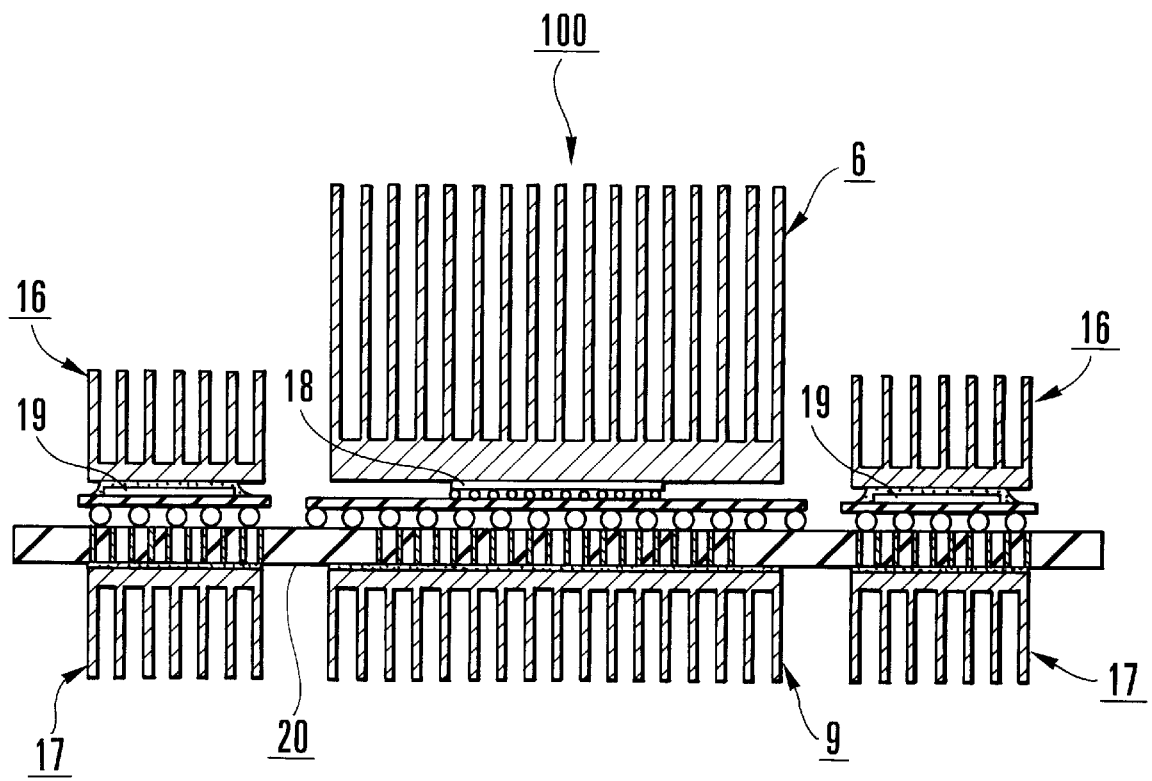
F I G. 5

INTEGRATED CIRCUIT DEVICE COOLING STRUCTURE

BACKGROUND OF THE INVENTION

The present invention relates to an integrated circuit device cooling structure and, more particularly, to an integrated circuit device cooling structure which cools an integrated circuit device, which is packaged by flip chip bonding called an area bump method or in a ball grid array (BGA) package, with air by attaching a heat sink to it.

Conventionally, in an integrated circuit device cooling structure of this type, the integrated circuit device is mounted on a wiring substrate such that its lower surface faces the upper surface of the wiring substrate. A heat sink is attached to the upper surface of the integrated circuit device.

FIG. 6 shows a conventional integrated circuit device of this type. Referring to FIG. 6, a heat sink 26 is arranged on the upper surface of an integrated circuit device 21. The lower surface of the heat sink 26 is fixed to the upper surface of the integrated circuit device 21 so that it is thermally coupled to the integrated circuit device 21. Heat generated by the integrated circuit device 21 is transmitted to the heat sink 26 and is radiated in the air.

Solder bumps 22 used for inputting/outputting signals and connecting a power supply are formed on the lower surface of the integrated circuit device 21. The integrated circuit device 21 is not directly mounted on a wiring substrate 25 but is mounted on an interposer substrate 23 through the solder bumps 22. This is because the solder bumps 22 have a small pitch and the integrated circuit device 21 cannot be directly mounted on the wiring substrate 25.

Solder balls 24 are arranged on the lower surface of the interposer substrate 23. The solder balls 24 are arranged at such a pitch that they can be mounted on the wiring substrate 25. The interposer substrate 23 is mounted on the wiring substrate 25 through the solder balls 24.

The prior art described above cannot cope with an increase in power consumption that accompanies an increase in operation speed and integration degree of the integrated circuit device 21. To cope with an increase in power consumption of the integrated circuit device 21, the size of the heat sink 26 must be increased, but the cooling performance does not increase in proportion to an increase in size of the heat sink 26. To attach a large heat sink 26 to the integrated circuit device 21, the attaching structure must also be improved in accordance with the heat sink 26.

SUMMARY OF THE INVENTION

It is an object of the present invention to provide an integrated circuit device cooling structure which can cope with an increase in power consumption that accompanies an increase in operation speed and integration degree of an integrated circuit device.

It is another object of the present invention to provide an integrated circuit device cooling structure which can obtain a sufficiently large cooling effect by only occupying a mounting region which is the same as or similar to the outer shape of the integrated circuit device.

In order to achieve the above objects, according to the present invention, there is provided an integrated circuit device cooling structure comprising a first substrate, an integrated circuit device mounted on a first surface side of the first substrate, a first heat radiation member fixed to a second surface of the first substrate and thermally coupled to the first substrate, and a through hole formed in the first substrate to transmit heat generated by the integrated circuit device to the first heat radiation member.

BRIEF DESCRIPTION OF THE DRAWINGS

FIG. 4 is a view showing a heat transmission path in the integrated circuit device cooling structure shown in FIG. 3;

FIG. 5 is a sectional view of a multi-chip package type integrated circuit device cooling structure according to the third embodiment of the present invention.

DESCRIPTION OF THE PREFERRED EMBODIMENTS

The present invention will be described in detail below with reference to the accompanying drawings.

Figure 1:
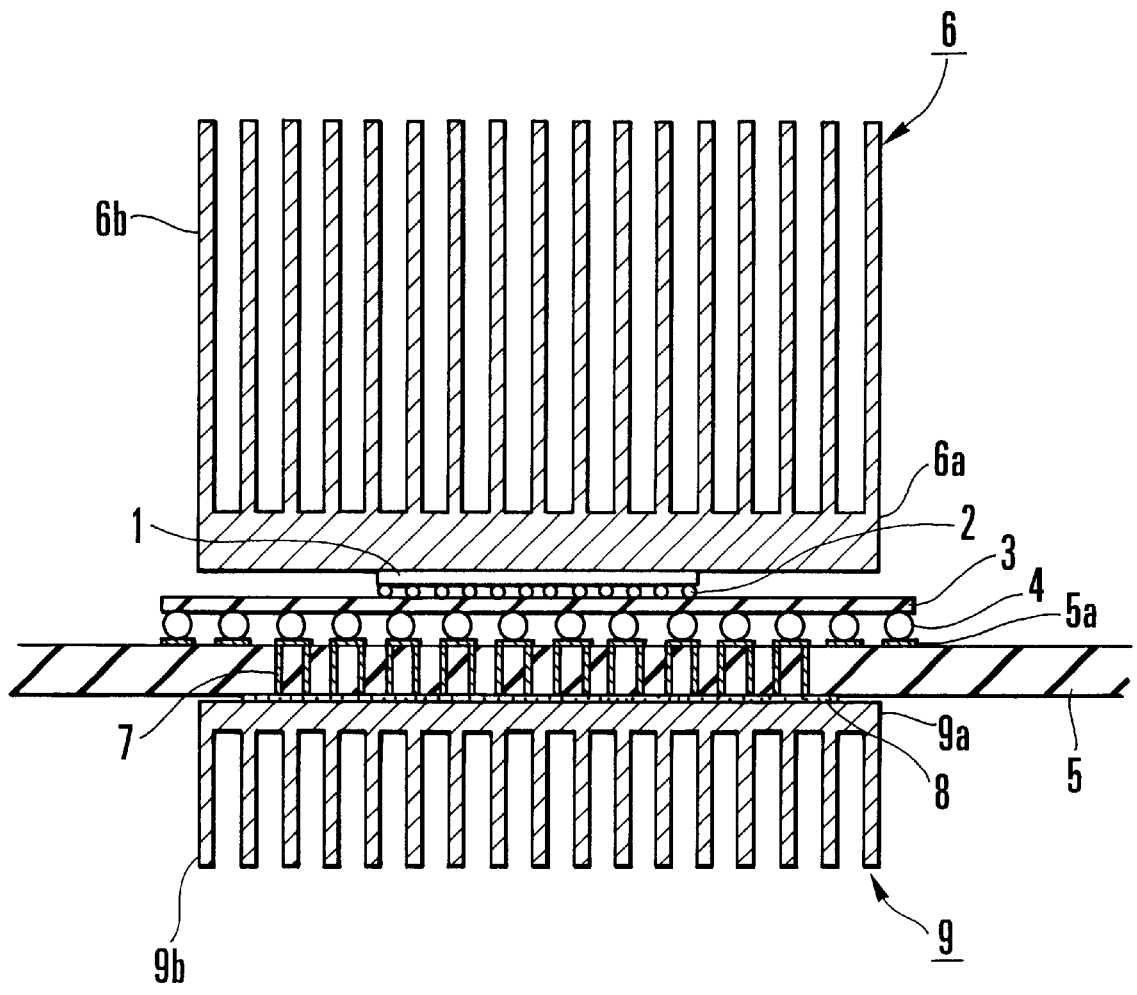
FIG. 1 is a sectional view of an integrated circuit device cooling structure according to the first embodiment of the present invention.

FIG. 1 shows an integrated circuit device cooling structure according to the first embodiment of the present invention. Referring to FIG. 1, the integrated circuit device of this embodiment has a wiring substrate 5, an integrated circuit device 1, heat sinks 6 and 9, and a plurality of heat radiation vias 7. Wiring patterns (not shown) are formed on the upper and lower surfaces of the wiring substrate 5. The integrated circuit device 1 is mounted on the upper surface side of the wiring substrate 5. The heat sink 6 is fixed to the upper surface of the integrated circuit device 1 to be thermally coupled to it. The heat sink 9 is attached to the lower surface of the wiring substrate 5 to be thermally coupled to it. The heat radiation vias 7 are formed to extend through the wiring substrate 5.

The heat sinks 6 and 9 have rectangular bottom plates 6a and 9a having the same size and a plurality of fins 6b and 9b extending vertically from the bottom plates 6a and 9a, respectively, and are monolithically molded of aluminum. The central portion of the bottom plate 6a of the heat sink 6 is fixed to the upper surface of the integrated circuit device 1, and the fins 6b of the heat sink 6 are arranged to extend upward to have a comb-like section. The bottom plate 9a of the heat sink 9 is fixed to the lower surface of the wiring substrate 5 through a heat radiation pad 8, as will be described later, and the fins 9b of the heat sink 9 are arranged to extend downward to have a comb-like section. The heat radiation vias 7 are formed in a region of the wiring substrate 5 that corresponds to the bottom plates 6a and 9a of the heat sinks 6 and 9.

A plurality of solder bumps 2 used for inputting/ outputting signals and connecting a power supply are arranged on the lower surface of the integrated circuit device 1. Since the pitch of arrangement of the solder bumps 2 is very small, an interposer substrate 3 is interposed between the integrated circuit device 1 and the wiring substrate 5. This is because the miniaturization of the wiring pattern of the wiring substrate 5 cannot catch up with the bump pitch and the integrated circuit device 1 cannot be mounted on the wiring substrate 5 directly.

The integrated circuit device 1 is mounted on the upper surface of the interposer substrate 3 through the solder bumps 2, and the interposer substrate 3 is mounted above the wiring substrate 5 to oppose its upper surface. The interposer substrate 3 is connected to the wiring substrate 5 through solder balls 4 that are arranged on the lower surface of the interposer substrate 3 at such a pitch that they can be mounted on the wiring substrate 5. Wiring patterns (not shown) are formed on the two surfaces of the interposer substrate 3, and the solder bumps 2 and the solder balls 4 are electrically connected to each other through these wiring patterns.

The interposer substrate 3 has a square shape with sides each having a size of about 5 cm. The interposer substrate 3 is made of a ceramic material, and more particularly, alumina or aluminum nitride. If the solder bumps 2 of the integrated circuit device 1 can be directly connected to the pattern of the wiring substrate 5, the interposer substrate 3 is not required.

The wiring substrate 5 has a plurality of pads 5a arranged at positions opposing the plurality of solder balls 4, the plurality of heat radiation vias 7, and an internal wiring. The wiring substrate 5 has a thickness of about 3 mm to 3.5 mm and a size of about 12 cm² to 13 cm². The material of the wiring substrate 5 is an epoxy or polyimide resin.

The heat radiation vias 7 transmit heat generated by the integrated circuit device 1 mounted on the upper surface side of the wiring substrate 5 to the lower surface of the wiring substrate 5. The heat radiation vias 7 are arranged in a matrix. Preferably, through holes constituting the heat radiation vias 7 are filled with a solder having a high thermal conductivity. In this case, the thermal conductivity can be further improved when compared to a case wherein nothing fills the heat radiation vias 7. The diameter of each heat radiation via 7 is 0.3 mm to 0.4 mm. The heat radiation vias 7 are arranged to be displaced from the solder balls 4 arranged on the interposer substrate 3 so that they are not electrically connected to them.

The heat sink 6 is attached to the upper surface of the integrated circuit device 1, i.e., to a surface opposite to a surface where the solder bumps 2 are formed. More specifically, the heat sink 6 is fixed to the upper surface of the integrated circuit device 1 by using an adhesive obtained by mixing device heat conductive filler particles, e.g., a metal oxide, in an epoxy or silicone resin, or by a low-melting metal, e.g., a solder. The heat sink 6 may be urged against the integrated circuit device 1 with a force of springs or screws. In this case, if a grease-type heat conductive material is applied to the contact surface between the heat sink 6 and integrated circuit device 1, thermal coupling between the heat sink 6 and integrated circuit device 1 can be made more firm.

The heat radiation pad 8 is arranged on the lower surface of the wiring substrate 5, i.e., on a surface opposite to a surface where the integrated circuit device 1 is mounted. The heat radiation pad 8 is formed in the process of forming the wiring pattern on the lower surface of the wiring substrate 5, and requires a size to include at least the plurality of heat radiation vias 7. The heat sink 9 is attached to the heat radiation pad 8 arranged on the lower surface of the wiring substrate 5. The heat sink 9 is fixed to the heat radiation pad 8 in the same manner as that with which the heat sink 6 is fixed.

Figure 2:
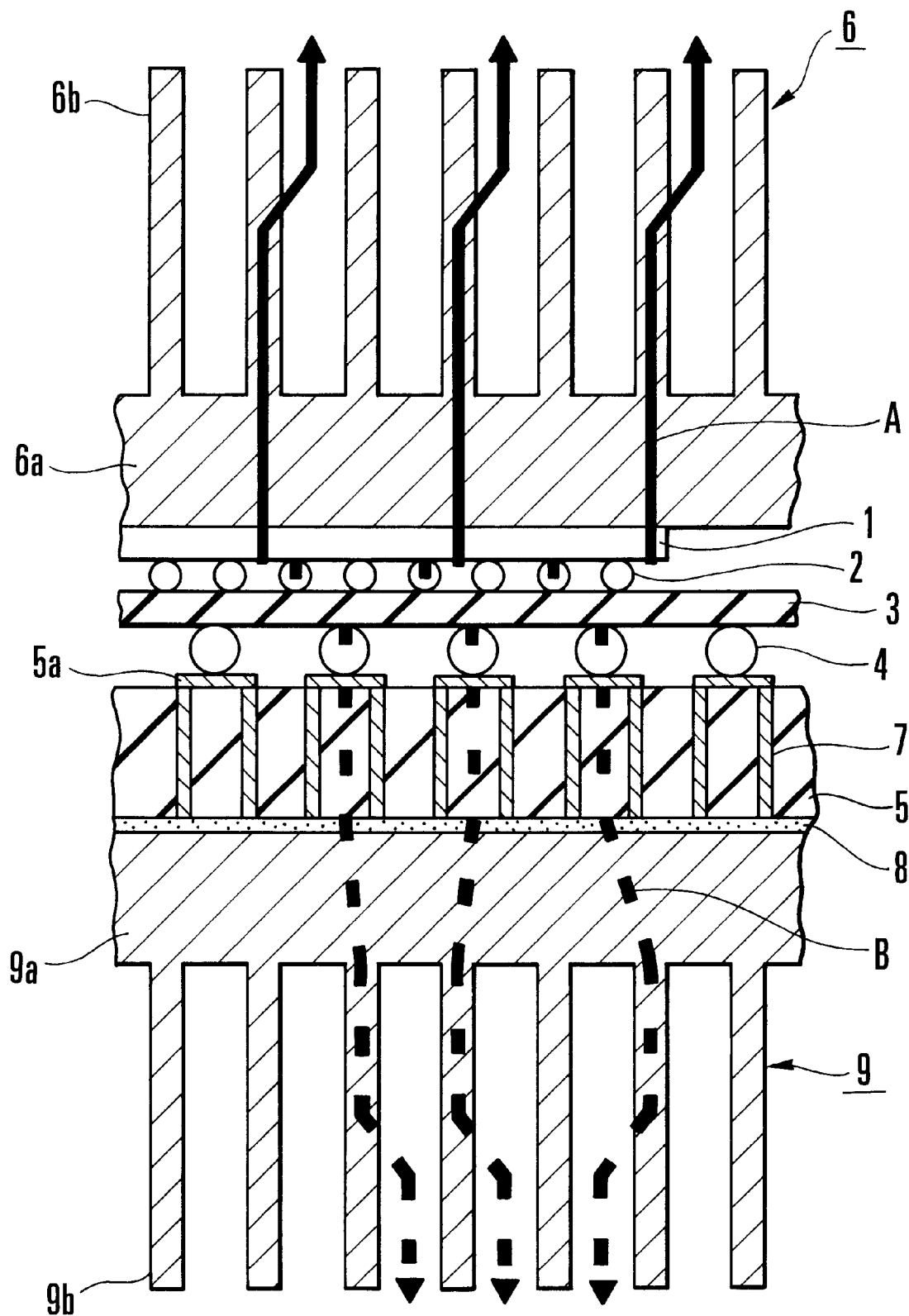
FIG. 2 is a view showing a heat transmission path in the integrated circuit device cooling structure shown in FIG. 1.

The operation of the integrated circuit device cooling structure having the above arrangement will be described with reference to FIG. 2. Referring to FIG. 2, heat generated by the integrated circuit device 1 is radiated from both the upper and lower surfaces of the integrated circuit device 1 along first and second transmission paths A and B.

The first transmission path A consists of the integrated circuit device 1 and the heat sink 6. Heat generated by the integrated circuit device 1 is transmitted in the integrated circuit device 1 to the heat sink 6 from the upper surface of the integrated circuit device 1, and is dissipated in the air through the bottom plate 6a and fins 6b of the heat sink 6.

The second transmission path B consists of the integrated circuit device 1, the solder bumps 2, the interposer substrate 3, the solder balls 4, the pads 5a, the wiring substrate 5, the heat radiation vias 7, the heat radiation pad 8, and the heat sink 9. Heat generated by the integrated circuit device 1 is transmitted to the interposer substrate 3 through the solder bumps 2, and to the wiring substrate 5 through the solder balls 4 and the pads 5a. Heat transmitted to the wiring substrate 5 is transmitted to the heat radiation pad 8 through the wiring substrate 5 itself and the heat radiation vias 7, is then transmitted from the heat radiation pad 8 to the bottom plate 9a and fins 9b of the heat sink 9, and is dissipated in the air.

In this manner, in this embodiment, the heat sink 9 is arranged on the surface of the wiring substrate 5 where the integrated circuit device 1 is not mounted, and the plurality of heat radiation vias 7 are arranged in the region of the wiring substrate 5 where the heat sink 9 is mounted. Hence, heat resistance in transmitting heat from the integrated circuit device 1 to the heat sink 9 through the wiring substrate 5 can be decreased.

This embodiment has two heat transmission paths, i.e., the first transmission path A on the upper surface side of the integrated circuit device 1 and the second transmission path B on the lower surface side of the integrated circuit device 1. Therefore, this embodiment can cope with an increase in power consumption that accompanies an increase in operation speed and integration degree of the integrated circuit device 1.

In this embodiment, the heat radiation pad 8 is arranged between the wiring substrate 5 and heat sink 9. However, the heat radiation pad 8 can be omitted. In this case, the heat sink 9 is attached directly to the wiring substrate 5.

In this embodiment, the heat radiation vias 7 and the solder balls 4 are located to be displaced from each other. However, the present invention can include an arrangement in which the heat radiation vias 7 and the solder balls 4 are electrically connected to each other. In a more preferable example, a specific heat radiation via 7 electrically connected to a specific solder ball 4 is used as an electrode for the power supply or GND.

The second embodiment of the present invention will be described in detail with reference to FIG. 3. The characteristic feature of the second embodiment resides in that the integrated circuit device is packaged in a ball grid array (BGA) package. Except for this, the arrangement of the second embodiment is identical to that of the first embodiment.

Figure 3:
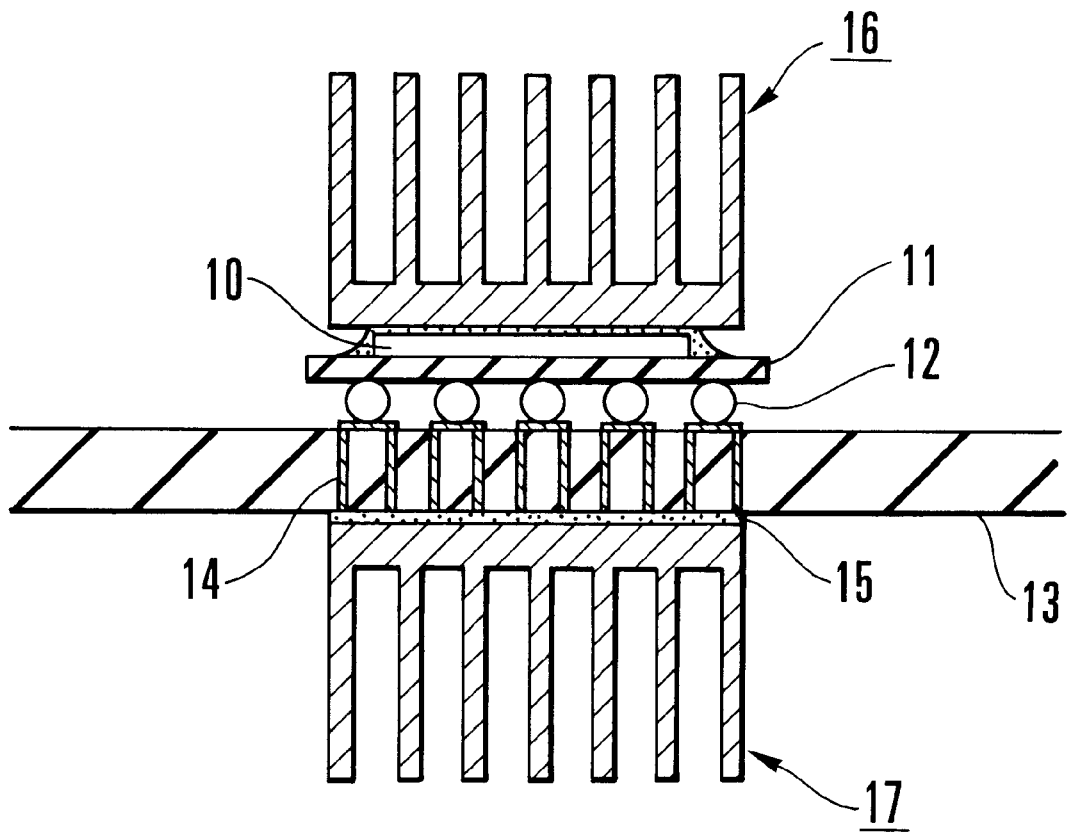
FIG. 3 is a sectional view of a ball grid array package type integrated circuit device cooling structure according to the second embodiment of the present invention.
Figure 6:
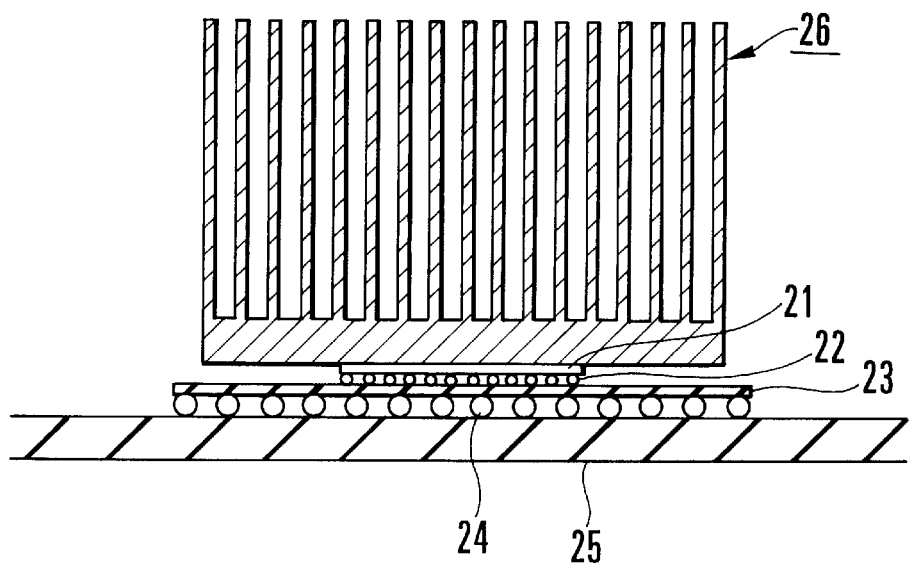
FIG. 6 is a sectional view of a conventional integrated circuit cooling structure.

Referring to FIG. 3, an integrated circuit device 10 is packaged in a BGA package 11. The integrated circuit device 10 is mounted such that its surface opposite to the circuit surface opposes the upper surface of the BGA package 11. The input/output terminals of the circuit surface of the integrated circuit device 10 and the electrodes on the upper surface of the BGA package 11 are connected to each other by wire bonding. The integrated circuit device 10 is sealed in the BGA package 11 with a resin.

Solder balls 12 are arranged on the lower surface of the BGA package 11 to electrically connect the BGA package 11 and a wiring substrate 13 to each other. A heat sink 16 is fixed to the upper surface of the BGA package 11 so as to be thermally coupled to the package 11. The outer shapes (of the bottom plates) of the heat sink 16 and of a heat sink 17 have almost the same size as that of the BGA package 11. The size of a region of the wiring substrate 13 where heat radiation vias 14 and a heat radiation pad 15 are formed also has almost the same size as the outer shape of the BGA package 11.

The operation of the integrated circuit device cooling structure having the above arrangement will be described with reference to FIG. 4. Referring to FIG. 4, heat generated by the integrated circuit device 10 is radiated along first and second transmission paths A and B.

In the first transmission path A, heat generated by the integrated circuit device 10 is transmitted to the heat sink 16 through the sealing resin of the BGA package 11, and is then dissipated in the air.

In the second transmission path B, heat generated by the integrated circuit device 10 is transmitted in the integrated circuit device 10 and BGA package 11, and is transmitted to the wiring substrate 13 through the solder balls 12 and pads 13a. Heat transmitted to the wiring substrate 13 is transmitted to the heat radiation pad 15 through the wiring substrate 13 itself and the heat radiation vias 14, is then transmitted from the heat radiation pad 15 to the heat sink 17, and is dissipated in the air.

In this manner, in this embodiment, the integrated circuit device 10 of the BGA package 11 can be sufficiently cooled by only mounting the heat sinks 16 and 17 on regions having sizes substantially equal to that of the outer shape of the BGA package 11.

The third embodiment of the present invention will be described in detail with reference to FIG. 5. The characteristic feature of the third embodiment resides in that the arrangements of the first and second embodiments described above are applied to a multi-chip module (MCM).

Referring to FIG. 5, a MCM 100 is constituted by mounting a microprocessor chip 18 and cache memory chips 19 on a wiring substrate 20. Since the microprocessor chip 18 has a comparatively large number of input/output signals, it is packaged by flip chip bonding. The cooling structure for cooling the microprocessor chip 18 preferably employs the first embodiment shown in FIG. 1.

Since the cache memory chips 19 are mass production products, they are packaged by using BGA packages that are standard packages. The cooling structure for cooling the cache memory chips 19 can employ the second embodiment shown in FIG. 3.

As the performance of the information processing apparatus in which the MCM 100 is packaged is more and more improved, the operation speed and integration degree of the integrated circuit device are increased. In this case, sometimes the microprocessor chip 18 consumes power of several W to 30 W, and even the cache memory chips 19 consume power equal to or larger than 1 W. In this embodiment, heat generated by this high power consumption can be efficiently removed.

In this embodiment, heat sinks are separately arranged on the upper surfaces of the microprocessor chip 18 and cache memory chips 19 and the lower surface of the wiring substrate 20 on which the microprocessor chip 18 and cache memory chips 19 are mounted, i.e., on a surface of the wiring substrate 20 where the microprocessor chip 18 and cache memory chips 19 are not mounted. Hence, large-size heat sinks need not be employed. As a result, a change in arrangement of the respective chips on the MCM 100, which is required when attaching large-size heat sinks, is not needed.

In the respective embodiments described above, the heat radiation vias are formed only in the wiring substrate. However, heat radiation vias may be formed in the interposer substrate as well so that a higher thermal conductivity can be obtained.

As is apparent from the above description, according to the present invention, heat generated by the integrated circuit device is transmitted to the heat sink arranged on the lower surface of the wiring substrate through a plurality of heat radiation vias formed in the wiring substrate. Therefore, heat resistance in transmitting heat from the integrated circuit device to the heat sink can be decreased.

Since the present invention has, as the heat transmission path for removing heat generated by the integrated circuit device, the first transmission path for transmitting heat to the first heat sink arranged on the upper surface side of the wiring substrate, and the second transmission path for transmitting heat to the second heat sink arranged on the lower surface side of the wiring substrate, the entire heat radiation amount increases. As a result, heat generated by the integrated circuit device can be removed effectively, coping with an increase in power consumption that accompanies an increase in operation speed and integration degree of the integrated circuit device.

What is claimed is:

1. A circuit device cooling structure comprising:
   a first substrate;
   a circuit device mounted on a first surface side of said first substrate;
   a first heat radiation member fixed to a second surface of said first substrate and thermally coupled to said first substrate;
   a second heat radiation member fixed to a surface of said circuit device that does not oppose said first substrate, and thermally coupled to said circuit device; and
   a through hole formed in said first substrate to transmit heat generated by said circuit device to said first and second heat radiation members.

2. A structure according to claim 1, further comprising
   a second substrate mounted on said first surface of said first substrate, and
   wherein said integrated circuit device is mounted on a surface of said second substrate that does not oppose said first substrate.

3. A structure according to claim 2, further comprising
   a connection member for connecting said first and second substrates to each other at least thermally,
   said connection member being arranged to be displaced from said through hole.

4. A structure according to claim 1, wherein said through hole is filled with a material having thermal conductivity.

5. A structure according to claim 4, further comprising
   a connection member for thermally and electrically connecting said first and second substrates to each other, and
   wherein said through hole is filled with an electrical conductive material having thermal conductivity, and
   said connection member is arranged to be in contact with said through hole.

6. A structure according to claim 1, wherein said first and second heat radiation members have bottom plates having almost the same size and a plurality of fins extending vertically from said bottom plates, respectively, and
   said through hole is arranged in a region of said first substrate that corresponds to said bottom plates.

7. A structure according to claim 1, further comprising:

a heat radiation pad formed on said second surface of said first substrate, and wherein said first heat radiation member is attached to a second surface side of said first substrate through said heat radiation pad.

8. A structure according to claim 7, wherein said through hole is arranged in a region of said first substrate that corresponds to said heat radiation pad.

9. A structure according to claim 1, wherein said integrated circuit device is packaged in a ball grid array (BGA) package, and said BGA package is mounted on said first surface side of said first substrate.

10. A structure according to claim 9, wherein said integrated circuit device is constituted by a microprocessor chip and a cache memory chip, said microprocessor chip is mounted on said first surface side of said first substrate, and said cache memory chip is packaged in a BGA package and mounted on said first surface side of said first substrate.

11. The structure according to claim 1, wherein said first heat radiation member is formed of metal.

12. The structure according to claim 1, wherein said second heat radiation member is formed of metal.

13. The structure according to claim 1, wherein first and second heat transmission paths are provided for transmitting heat generated by said circuit device away from said circuit device.

14. The structure according to claim 13, wherein said second transmission path includes said circuit device and the second heat radiation member.

15. The structure according to claim 1, wherein said second heat radiation member is fixed directly to said surface of said circuit device, and wherein said second heat radiation member is fixed directly to said surface of said circuit device.

* * * * *